United States Patent
Kim et al.

(10) Patent No.: US 7,679,409 B2
(45) Date of Patent: Mar. 16, 2010

(54) SEMICONDUCTOR DEVICE HAVING INPUT CIRCUIT WITH AUXILIARY CURRENT SINK

(75) Inventors: Mi Hye Kim, Seoul (KR); Jae Jin Lee, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 79 days.

(21) Appl. No.: 12/138,024

(22) Filed: Jun. 12, 2008

(65) Prior Publication Data

US 2009/0184737 A1 Jul. 23, 2009

(30) Foreign Application Priority Data

Jan. 18, 2008 (KR) ....................... 10-2008-0005897

(51) Int. Cl.
*H03B 1/00* (2006.01)
(52) U.S. Cl. ................. 327/108; 327/109; 327/560
(58) Field of Classification Search ............... 327/108, 327/109, 560–563, 359; 330/252–253, 261–264, 330/273

See application file for complete search history.

(56) References Cited

U.S. PATENT DOCUMENTS

| 4,795,916 | A | * | 1/1989 | Liron | ........................... 326/89 |
| 5,185,582 | A | * | 2/1993 | Barbu | ......................... 330/261 |
| 6,034,568 | A | * | 3/2000 | Bonaccio et al. | ............ 330/253 |
| 2009/0184757 | A1 | * | 7/2009 | Kim et al. | .................... 327/541 |

* cited by examiner

*Primary Examiner*—An T Luu
(74) *Attorney, Agent, or Firm*—Ladas & Parry LLP

(57) ABSTRACT

A semiconductor device stabilizes an operation of an input buffer. A semiconductor device includes an input potential detection unit outputting a detection signal in response to a level of an input signal. An input buffer buffers the input signal by performing a differential amplifying operation through a first current sink unit. A second current sink unit, sharing an output with the input buffer, differentially amplifies the input signal of the input buffer in response to a level of the detection signal.

20 Claims, 4 Drawing Sheets

US 7,679,409 B2

SEMICONDUCTOR DEVICE HAVING INPUT CIRCUIT WITH AUXILIARY CURRENT SINK

CROSS-REFERENCE TO RELATED APPLICATIONS

The present application claims priority to Korean patent application number 10-2008-0005897 filed on Jan. 18, 2008, which is incorporated herein by reference in its entirety.

BACKGROUND OF THE INVENTION

The present invention relates to a semiconductor device, and more particularly to an input circuit of a semiconductor device that ensures a stable operation.

A semiconductor device generally includes a signal transferring unit receiving and transferring a signal and a signal processing unit processing the signal transferred by the signal transferring unit according to a unique predetermined operation.

The signal processing unit is generally referred to as a core circuit of a semiconductor device, and as many devices as are allowed by semiconductor device design and processing technology are integrated in the core circuit.

The signal transferring unit includes an input circuit, which transfers an external signal to the signal processing unit within a semiconductor device, and an output circuit, which outputs data transferred from the signal processing unit to the outside.

In a semiconductor device, particularly in a semiconductor memory device, the input circuit primarily receives an external address signal or an external data signal and transfers it to an internal memory core region and the output buffer outputs a data signal corresponding to the inputted address to the outside.

The operation of a semiconductor device is only reliable when accurate buffering is ensured, and therefore the input circuit, which transfers the external data signal or the external address signal to the inside, that performs an accurate buffering operation is desired.

FIG. 1 is a circuit diagram showing an input circuit of a semiconductor device according to a related art, and illustrates an input circuit having a differential amplifier structure in a general semiconductor memory device, for example a DRAM.

The circuit in FIG. 1 includes an input buffer 100 receiving input signals in and inb, a delaying circuit 200 delaying the output signal of the input buffer 100, a clock buffer 300 receiving clock signals CLK, and CLKB and a strobe & latch circuit 400 receiving both the output of the delaying circuit 200 and the output signal of the clock buffer 300.

In general, the input buffer 100 receives and differentially amplifies the input signals in and inb. For example, the control signals in and inb can be an external signal such as a memory address signal, a control signal, or other such signal.

The delaying circuit 200 adjusts a timing, i.e., a setup time or a hold time, that synchronizes the input signals in and inb (e.g., an address signal, a control signal, or other such signal) with a clock.

The clock buffer 300 receives the system clock signals CLK and CLKB from the outside.

The strobe & latch circuit 400 receives both the output of the clock buffer 300 and the output of the delaying circuit 200 and performs a clock synchronization.

The input circuit in FIG. 1 is configured as a differential input buffer that receives a differential signal. Herein, the differential input refers to signals having opposite phases, such as clocks CLK and CLKB.

The input signals in and inb are inputted into the input buffer 100, which differentially amplifies the input signals in and inb. The crossing point of the differential input (the point at which the signal in and the signal inb are crossed) is referred to as VIX.

Herein, generally the level of the crossing point VIX is a voltage reference level Vref, i.e. VCC/2. However, it may also be possible that the level of the crossing point VIX is not exactly adjusted to the level of the reference voltage Vref because of the influence of a noise or other such disturbance in the system.

It is required that an output signal react at a constant speed with respect to the input signal even when the level of the crossing point VIX is higher or lower than the Vref level. Particularly, problems arise when the input potential is low, which results in a delay of the output signal. The delay of the output signal causes large variation in both the setup time and the hold time, and therefore the input circuit does not operate stably.

FIG. 2 is a graph illustrating the variation in the operation speed of the input buffer 100 according to the variation in the input potentials of the input signals in and inb of FIG. 1, and variation in delay extent 't' according to the variation in the input potentials of the input signals in and inb is shown. Herein, 't' is a time taken for the input signals in and inb to be both inputted into the input buffer 100 and then outputted from the input buffer 100. Meanwhile, variation pattern or variation amount of 't' may be varied as the type of the input buffer 100.

FIG. 3 shows a general circuit diagram of a conventional differential amplifying structure, and shows an example of an input buffer 100 having the properties described above with reference to FIG. 2.

In the conventional differential amplifying structure shown in FIG. 3, when an enable signal en becomes a logic high level, a driving transistor 32 is turned on and the input buffer 100 operates. That is, the input buffer 100 compares and amplifies the levels of the input signals in and inb, and outputs a buffer output signal buf_out.

When the enable signal en becomes a logic low level, the driving transistor 32 is turned off and the input buffer 100 no longer operates. That is, when the enable signal en is at a logic low level, the input buffer 100 does not compare the input signals in and inb, rather the input buffer 100 outputs the buffer output signal buf_out at a high level according to the operation of PMOS transistors 34 and 36, which receive the enable signal en through respective gates. The buffer output signal buf_out is maintained at a high level to prevent a node outputting the buffer output signal buf_out from being floated when the input buffer 100 is in the disabled state.

Referring again to FIG. 2, the crossing point VIX is higher than the reference voltage level during the period A PERIOD and the crossing point VIX is lower than the Vref level during the period B PERIOD. FIG. 2 shows that during the period B PERIOD 't' has greater value than during the period A PERIOD. As shown in FIG. 2, as the input levels of the input signals in and inb are decreased, the setup time and the hold time are largely varied by delay of the output signal and thus the input buffer does not operate stably.

As described above, in a related art, voltage differences Vgs between gate and source of NMOS transistors N0 and N1 in FIG. 3 are lower than a threshold voltage Vth when the level of the input voltage of the input buffer is lowered. Therefore, the NMOS transistors N0 and N1 are turned off for a period and the input buffer does not operate normally during this period. As such, there is a problem with the conventional semiconductor device in that a semiconductor memory device may malfunction when the NMOS transistors N0 and N1 are turned off.

SUMMARY OF THE INVENTION

There is provided a semiconductor integrated circuit that minimizes an influence of variation in a level of an input signal in an input buffer and thus stabilizes the operation.

Also, there is provided a semiconductor integrated circuit that controls a threshold voltage within an input buffer in response to a level of an input signal and thus ensures stability of an operation.

According to a first aspect of the present invention, a semiconductor device includes an input potential detection unit outputting a detection signal in response to a level of an input signal, an input buffer buffering the input signal by performing a differential amplifying operation through a first current sink unit, and a second current sink unit sharing an output with the input buffer and differentially amplifying the input signal of the input buffer in response to a level of the detection signal.

Preferably, the input potential detection unit includes a reference voltage generation unit generating a reference voltage, an input unit transmitting the reference voltage in response to the level of the input signal, and an output control unit outputting the reference voltage transmitted from the input signal as the detection signal in response to an activation of an enable signal.

Preferably, the input unit transmits the reference voltage when the level of the input signal is lower than a predetermined level.

Preferably, the enable signal is an enable signal of the input buffer.

Preferably, the input buffer is a buffer in such a structure that differentially amplifies the input signal through the current sink unit.

Preferably, the input buffer is driven in response to an activation of an enable signal.

Preferably, the current sink unit includes a first auxiliary input unit inputting a first input signal of the input buffer, a second auxiliary input unit inputting a second input signal of the input buffer, and a low potential input driving unit commonly connected to the first and second auxiliary input units, and aiding the differential amplifying of the first and second auxiliary input units in response to the input of the detection signal.

Preferably, the first auxiliary input unit includes a first NMOS transistor having a lower threshold voltage than a first transistor of the input buffer.

Preferably, the second auxiliary input unit includes a second NMOS transistor having a lower threshold voltage than a second transistor of the input buffer.

Preferably, the low potential input driving unit includes a third NMOS transistor driven in response to an activation input of the detection signal.

According to a second aspect of the present invention, a semiconductor device includes an input potential detection unit outputting a detection signal in response to a level of an input signal, and an input buffer differentially amplifying and outputting the input signal, and, at the same time, selectively and auxiliary differentially amplifying a signal outputted in response to a level of the detection signal.

Preferably, the input potential detection unit includes a reference voltage generation unit generating a reference voltage, an input unit transmitting the reference voltage in response to the level of the input signal, and an output control unit outputting the reference voltage transmitted from the input signal as the detection signal in response to an activation of an enable signal.

Preferably, the input unit transmits the reference voltage when the level of the input signal is lower than a predetermined level.

Preferably, the enable signal is an enable signal of the input buffer.

Preferably, the input buffer is a buffer in such a structure that differentially amplifies the input signal with current sink.

Preferably, the input buffer is driven in response to an activation of an enable signal.

Preferably, the input buffer is provided with a current sink unit performing the auxiliary differential amplification, and the current sink unit includes a first auxiliary input unit inputting a first input signal of the input buffer, a second auxiliary input unit inputting a second input signal of the input buffer, and a low potential input driving unit commonly connected to the first and second auxiliary input units, and driving the differential amplifying of the first and second auxiliary input units in response to the input of the detection signal.

Preferably, the first auxiliary input unit includes a first NMOS transistor having a lower threshold voltage than the transistor of the input buffer.

Preferably, the second auxiliary input unit includes a second NMOS transistor having a lower threshold voltage than the transistor of the input buffer.

Preferably, the low potential input driving unit includes a third NMOS transistor driven in response to an activation input of the detection signal.

According to the present invention, it is possible to minimize the influence of level variation in input signal and thus stabilize an operation of a semiconductor integrated circuit even though the level of the input signal inputted into the input buffer.

DESCRIPTION OF SPECIFIC EMBODIMENTS

Hereinafter, preferred embodiments of the present invention will be described in detail with reference to the accompanying drawings.

The present invention includes an input circuit of a semiconductor device that reduces current consumption when the potential level of input signals (e.g., an address signal, various control signals, or a data signal) is high, and the device operates stably even when the potential level of input signals is low, thereby stabilizing the operation of the circuit as a whole.

According to an embodiment of the present invention, a semiconductor integrated circuit includes an input potential detection unit that outputs a detection signal according to a level of an input signal, and an input buffer performing a differential amplifying operation through a first current sink unit to buffer the input signal and a second current sink unit differentially amplifying the input signal of the buffer circuit and the detection signal of the input potential detection unit in response to the level of the detection signal.

In the above configuration, the second current sink unit may be designed integrally with the input buffer or alternatively may be designed separately from the input buffer.

Figure 4:
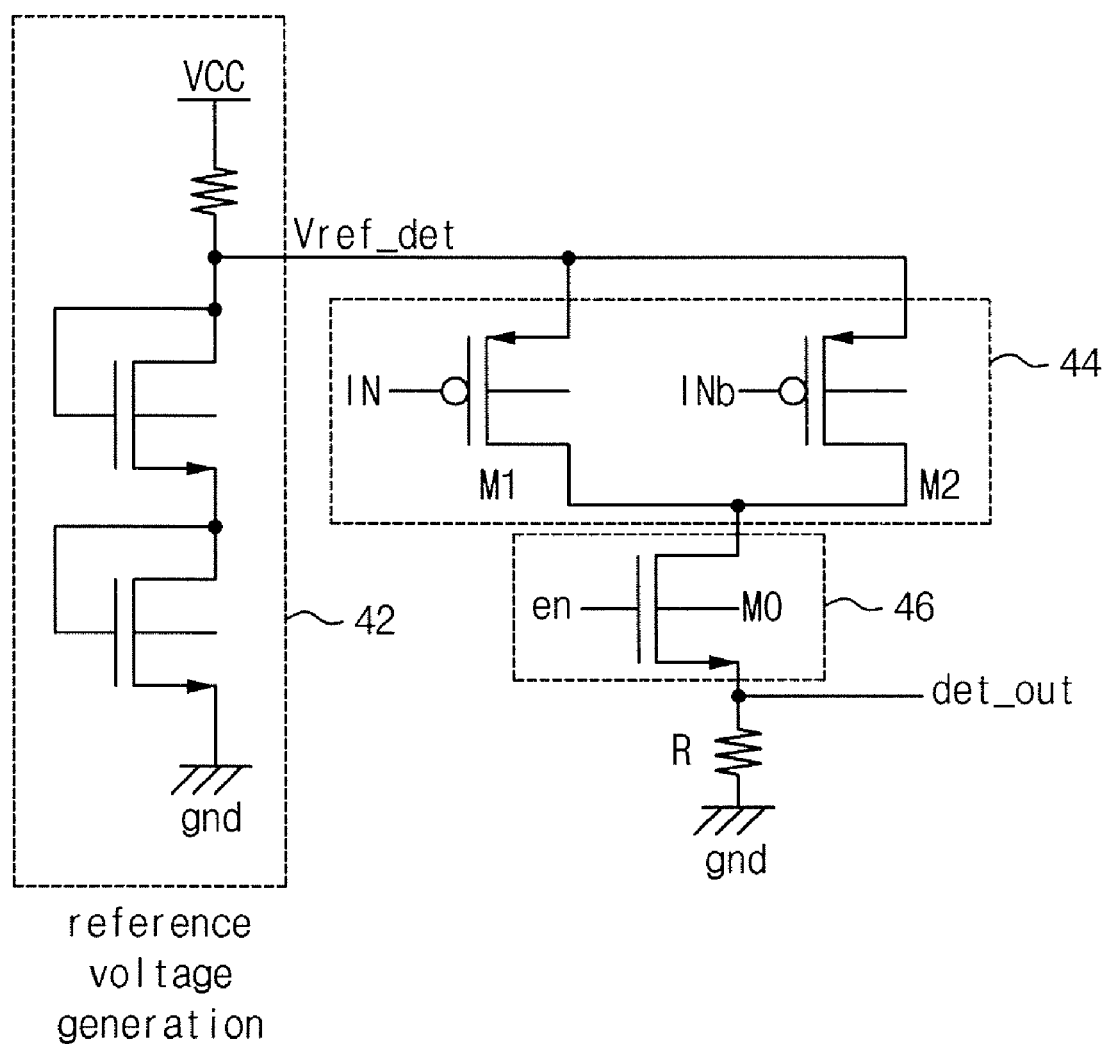
FIG. 4 is a circuit diagram showing an example of an input potential detection unit according to an embodiment of the present invention.

FIG. 4 is a circuit diagram showing an example of an input potential detection unit according to an embodiment the present invention.

The input potential detection unit includes a reference voltage generation unit 42 generating a reference voltage Vref_det, an input unit 44 transmitting the reference voltage Vref_det in response to the respective levels of input signals IN and INb, and an output control unit 46 outputting the reference voltage Vref_det transmitted via the input unit 44 as a detection signal det_out in response to activation of an enable signal en.

The input unit 44 transmits the reference voltage Vref_det when the level of the input signals IN and INb is lower than a predetermined level (conventionally, this predetermined level is determined as a product specification). The enable signal en is an enable signal of the input buffer. The reference voltage generation unit 42 may be a conventional constant voltage generation circuit.

The input unit 44 may include a PMOS transistor M1 that receives the input signal IN via a gate thereof and a PMOS transistor M2 that receives the input signal INb via a gate thereof. The output control unit 46 may include a NMOS transistor M0 that receives the input buffer enable signal en via a gate thereof.

The operation of the device according to the configuration as shown in FIG. 4 is described below.

The level of the reference voltage Vref_det outputted from the reference voltage generation unit 42 may be varied according to the configuration and design of the reference voltage generation circuit 42. The enable signal en which is applied to the gate of the NMOS transistor M0, which configures the output control unit 46, is a identical to the input buffer enable signal.

The enable signal en has a logic high state when the input buffer is in an enable state, and has a logic low state when the input buffer is in a disable state. The input potential detection unit circuit shown in FIG. 4 operates when the enable signal en is in a high state, and the NMOS transistor M0 configuring the output control unit 46 is turned off and the detection signal det_out is fixed to a low level when the enable signal is in a low state.

In the input potential detection unit as shown in FIG. 4, the PMOS transistors M1 and M2 of the input unit 44 receive the input signals IN and INb. When the input signals IN and INb have a high level the detection signal det_out transitions to a low level, and when the input signals IN and INb have a low level the detection signal det_out transitions to a high level.

Figure 5:
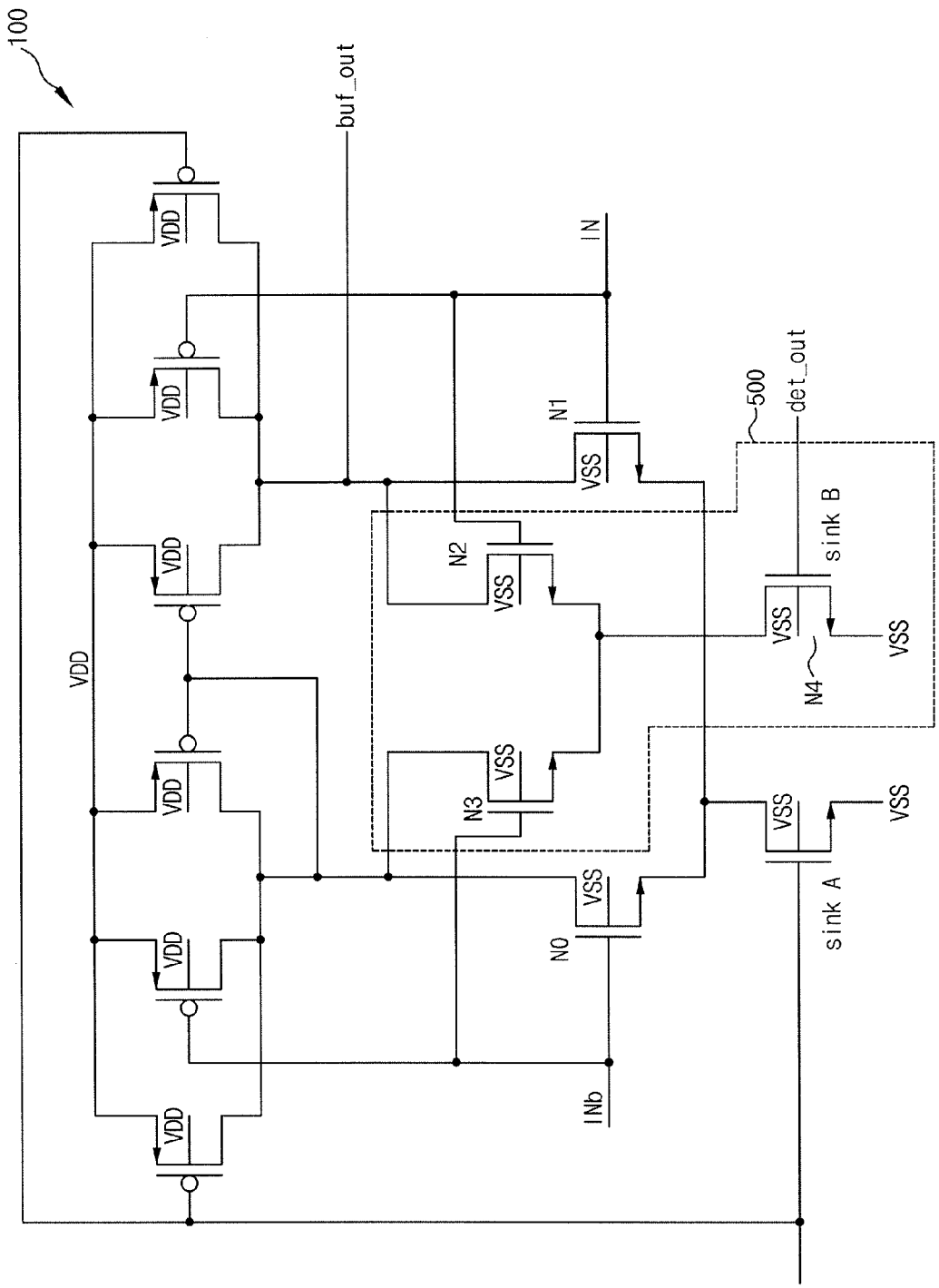
FIG. 5 is a circuit diagram showing an example of an input buffer having a second current sink unit according to an embodiment of the present invention.

FIG. 5 is a circuit diagram showing an example of an input buffer having a second current sink unit according to an embodiment of the present invention. As shown in FIG. 5, a portion denoted by a reference numeral 100 is substantially the same as a portion denoted by the reference numeral 100 in FIG. 3, except for the portion denoted by a reference numeral 500 in FIG. 5. That is, the reference numeral 100 denotes a buffer circuit of a conventional differential amplifying structure, and the reference numeral 500 denotes the second current sink unit according to the present invention.

Figure 1:
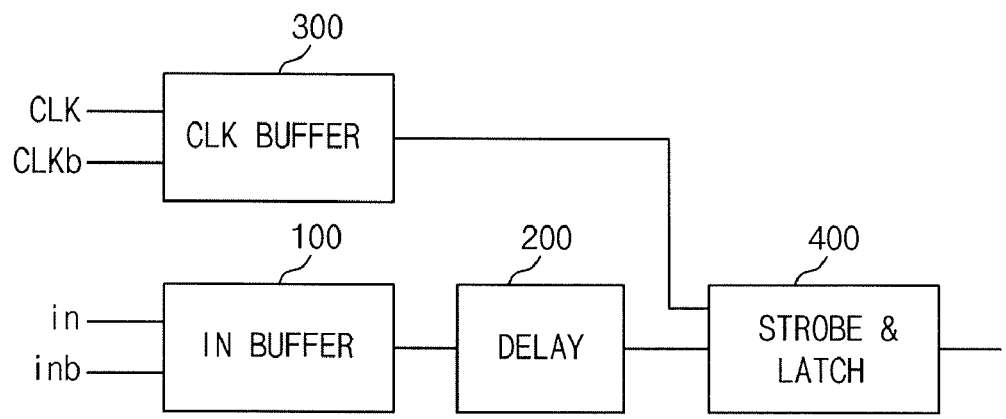
FIG. 1 is a block diagram showing a conventional input circuit.
Figure 2:
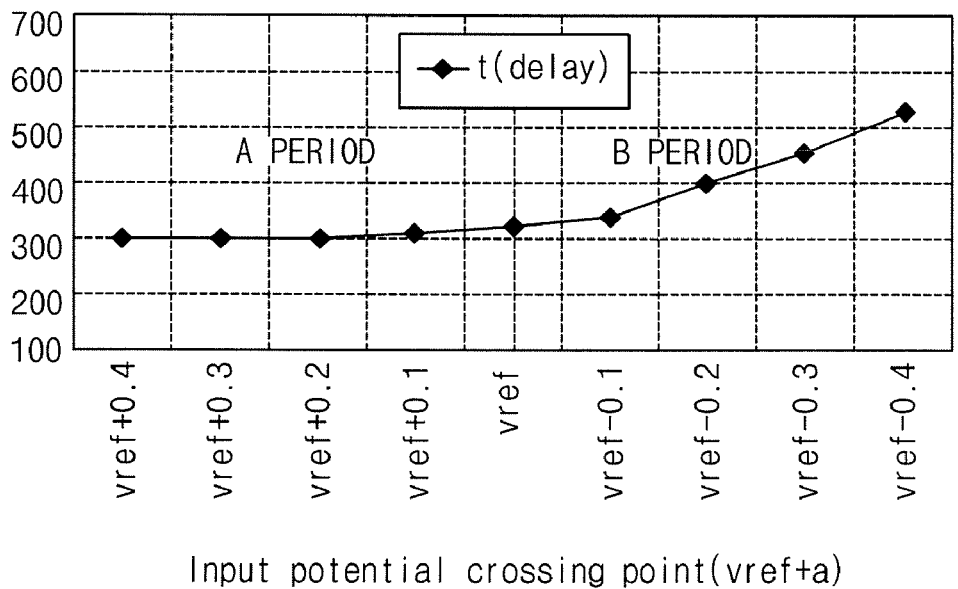
FIG. 2 is a graph illustrating an operation property of the input buffer in FIG. 1.
Figure 3:
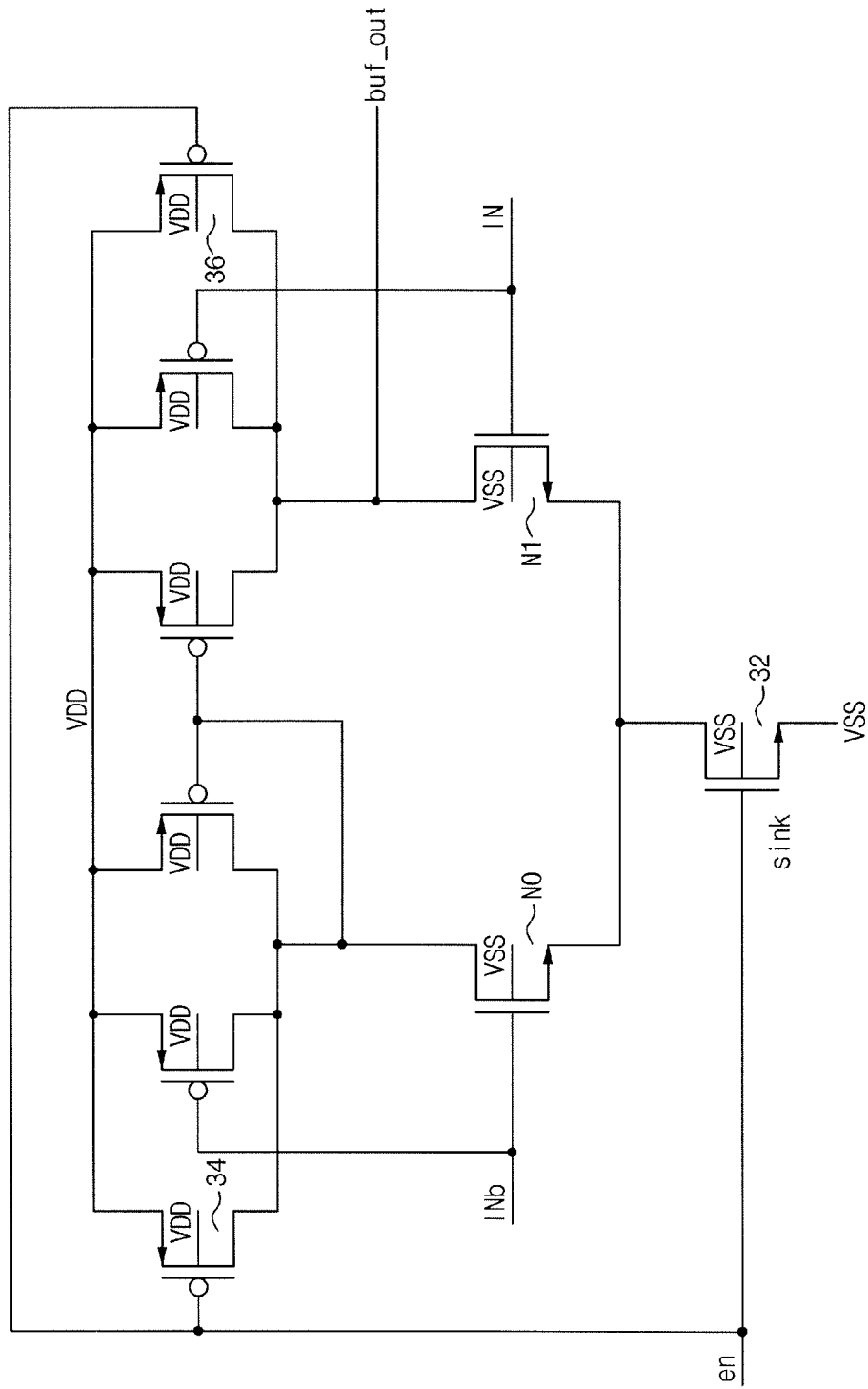
FIG. 3 is a circuit diagram showing the input buffer in FIG. 1.

In FIG. 5, the buffer circuit 100 is identical to the configuration of the circuit shown in FIG. 3 and described above, and thus is given the same reference numeral. Herein, the input buffer may include both the buffer circuit 100 and the second current sink unit 500, or the input buffer may include the buffer circuit 100 alone and the second current sink unit 500 may be a separate component.

In the configuration in FIG. 5, the buffer circuit 100 is provided in a structure that differentially amplifies the input signals IN and INb. The buffer circuit 100 is driven in response to activation of the enable signal en.

The second sink unit 500 includes a first auxiliary input unit N2 receiving the first input signal IN, a second auxiliary input unit N3 receiving the second input signal Inb, and a low input potential driving unit N4 commonly connected to the first and second auxiliary input unit N2 and N3 and driving in response to input of the detection signal det_out.

The first auxiliary input unit N2 includes a first NMOS transistor N2 having a lower threshold voltage Vth than the transistor N1 of the buffer circuit 100.

The second auxiliary input unit N3 includes a second NMOS transistor N3 having a lower threshold voltage Vth than the transistor N0 of the buffer circuit 100.

The low input potential driving unit N4 includes a third NMOS transistor N4 driven in response the detection signal det_out.

Referring to FIG. 5, when the buffer circuit 100 is in an enabled state and the input voltage is low, the enable signal en='H' and the detection signal det_out='H', where 'H' means logic level high. The second current sink unit 500 as shown in FIG. 5 is enabled when the detection signal det_out='H', and thus the third NMOS transistor N4 is turned on.

Accordingly, both the first auxiliary input unit N2, i.e. the first NMOS transistor N2, and the second auxiliary input unit N3, i.e. the second NMOS transistor N3, are driven, thereby aiding the driving of the first input unit N1 and the second input unit N0 respectively. Therefore, the entire circuit operates stably even when the input voltage of the buffer circuit 100 is low.

Meanwhile, when the buffer circuit 100 is in an enabled state and the input voltage is high, the enable signal en='H' and the detection signal det_out='L', where 'L' means logic level low. The, the second current sink unit 500 in FIG. 5 is disabled when the detection signal det_out='L' and thus the third NMOS transistor N4 is turned off. Accordingly, the first auxiliary input unit, i.e. the first NMOS transistor N2, and the second auxiliary input unit N3, i.e. the second NMOS transistor N3, are not driven. At this time, only the first input unit N1 and the second input unit N0 are driven.

According to this embodiment of the present invention, the second current sink unit 500 having a low threshold voltage is turned on and thus the buffer circuit operates stably when the input potential is low, and the buffer circuit 100 alone operates when the input potential is high. Therefore, it is possible to stabilize the output of the buffer circuit and thus a DRAM or other semiconductor integrated circuit can operates stably.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor device, comprising:
   an input potential detection unit receiving an input signal and outputting a detection signal in response to a level of the input signal;
   an input buffer receiving the input signal and buffering the input signal by performing a differential amplifying operation through a first current sink unit; and
   a second current sink unit having a common output with the input buffer and differentially amplifying the input signal of the input buffer in response to a level of the detection signal.

2. The semiconductor device as set forth in claim 1, wherein the input potential detection unit comprises:
   a reference voltage generation unit generating a reference voltage;
   an input unit receiving the reference voltage and transmitting the reference voltage in response to the level of the input signal; and
   an output control unit receiving the reference voltage transmitted from the input unit and outputting the reference voltage transmitted from the input unit as the detection signal in response to an activation of an enable signal.

3. The semiconductor device as set forth in claim 2, wherein the input unit transmits the reference voltage when the level of the input signal is lower than a predetermined level.

4. The semiconductor device as set forth in claim 2, wherein the enable signal is an enable signal of the input buffer.

5. The semiconductor device as set forth in claim 1, wherein the input buffer is a buffer in a structure that differentially amplifies the input signal through the current sink unit.

6. The semiconductor device as set forth in claim 5, wherein the input buffer is driven in response to an activation of an enable signal.

7. The semiconductor device as set forth in claim 1, wherein the second current sink unit comprises:
   a first auxiliary input unit receiving a first input signal of the input buffer;
   a second auxiliary input unit receiving a second input signal of the input buffer; and
   a low potential input driving unit commonly connected to the first and second auxiliary input units, and driving the differential amplifying of the first and second auxiliary input units in response to the detection signal.

8. The semiconductor device as set forth in claim 7, wherein the first auxiliary input unit includes a first NMOS transistor having a lower threshold voltage than a first transistor of the input buffer.

9. The semiconductor device as set forth in claim 8, wherein the second auxiliary input unit includes a second NMOS transistor having a lower threshold voltage than a second transistor of the input buffer.

10. The semiconductor device as set forth in claim 9, wherein the low potential input driving unit includes a third NMOS transistor driven in response to an activation of the detection signal.

11. A semiconductor device, comprising:
    an input potential detection unit outputting a detection signal in response to a level of an input signal; and
    an input buffer differentially amplifying and outputting the input signal and selectively providing auxiliary differential amplification of a signal outputted in response to a level of the detection signal.

12. The semiconductor device as set forth in claim 11, wherein the input potential detection unit comprises:
    a reference voltage generation unit generating a reference voltage;
    an input unit receiving the reference voltage and transmitting the reference voltage in response to the level of the input signal; and
    an output control unit receiving the reference voltage transmitted from the input unit and outputting the reference voltage transmitted from the input signal as the detection signal in response to an activation of an enable signal.

13. The semiconductor device as set forth in claim 12, wherein the input unit transmits the reference voltage when the level of the input signal is lower than a predetermined level.

14. The semiconductor device as set forth in claim 12, wherein the enable signal is an enable signal of the input buffer.

15. The semiconductor device as set forth in claim 11, wherein the input buffer is a buffer in a structure that differentially amplifies the input signal with current sink.

16. The semiconductor device as set forth in claim 15, wherein the input buffer is driven in response to an activation of an enable signal.

17. The semiconductor device as set forth in claim 11, wherein the input buffer is provided with a current sink unit performing the auxiliary differential amplification, and the current sink unit comprises:
    a first auxiliary input unit receiving a first input signal of the input buffer;
    a second auxiliary input unit receiving a second input signal of the input buffer; and
    a low potential input driving unit commonly connected to the first and second auxiliary input units, and driving the differential amplifying of the first and second auxiliary input units in response to the detection signal.

18. The semiconductor device as set forth in claim 17, wherein the first auxiliary input unit includes a first NMOS transistor having a lower threshold voltage than a first transistor of the input buffer.

19. The semiconductor device as set forth in claim 18, wherein the second auxiliary input unit includes a second NMOS transistor having a lower threshold voltage than a second transistor of the input buffer.

20. The semiconductor device as set forth in claim 19, wherein the low potential input driving unit includes a third NMOS transistor driven in response to an activation of the detection signal.

* * * * *